United States Patent [19]

Weinman, Jr.

[11] Patent Number: 5,461,379
[45] Date of Patent: Oct. 24, 1995

[54] DIGITAL CODING TECHNIQUE WHICH AVOIDS LOSS OF SYNCHRONIZATION

[75] Inventor: Joseph B. Weinman, Jr., West Long Branch, N.J.

[73] Assignee: AT&T IPM Corp., Coral Gables, Fla.

[21] Appl. No.: 166,405

[22] Filed: Dec. 14, 1993

[51] Int. Cl.[6] .................................................. H03M 5/16
[52] U.S. Cl. ............................................. 341/57; 375/286
[58] Field of Search ................................. 341/50, 56, 57

[56] References Cited

U.S. PATENT DOCUMENTS

| 4,244,051 | 1/1981 | Fujikura et al. | 375/17 |
|---|---|---|---|
| 4,419,757 | 12/1983 | De Gennaro et al. | 375/17 |
| 4,521,766 | 6/1985 | Vry | 341/56 |

OTHER PUBLICATIONS

H. C. Ferreira, et al., "On Ternary Error Correcting Line Codes", *IEEE Transactions on Communications*, vol. 37, No. 5, May 1989, Correspondence, pp. 510–515.
P. A. Franasazek, "Sequence–State Coding for Digital Transmission", (Manuscript received May 9, 1967), *Technical Journal*, Jan. 1968, pp. 143–157.
J. B. Buchner, "Ternary line codes", *Philips Telecommunication Review*, vol. 34, No. 2, Jun. 1976, pp. 72–86.
Brian H. Marcus, et al., "Finite–State Modulation Codes for Data Storage", *IEEE Journal on Selected Areas in Communications*, vol. 10, No. 1, Jan. 1992, pp. 5–37.
Peter A. Franaszek, "Coding for constrained channels: A comparison of two approaches", *IBM J. Res. Develop.*, vol. 33, No. 6, Nov. 1989, pp. 602–607.
Umit Aygolu, et al., "New Ternary Line Codes Based on Trellis Structure", *IEEE Transactions on Communications*, vol. 41, No. 6, Jun. 1993, pp. 864–871.
N. Q. Duc, "Line Coding Techniques for Baseband Digital Transmission", *A.T.R.*, vol. 9, No. 1, 1975, pp. 3–17.
N. Q. Duc and B. M. Smith, "Line Coding for Digital Data Transmission", *A.T.R.* vol. 9, No. 1, 1975.
Subbarayan Pasupathy, "Minimum Shift Keying: A Spectrally Efficient Modulation", reprinted from *IEEE Communications Society Magazine*, Jul. 1979, vol. 17, No. 4, pp. 14–22, pp. 87–96.
Subbarayan Pasupahty, "Correlative Coding: A Bandwith—Efficient Signaling Scheme" reprinted from *IEEE Communications Society Magazine*, Jul. 1977, vol. 15, No. 4, pp. 4–11, pp. 78–86.
P. J. van Gerwen, "On the Generation and Application of Pseudo–Ternary Codes in Pulse Transmission", *Philips Res. Repts*, vol. 20, No. 5, pp. 485–658, pp. 469–484, 1965.

(List continued on next page.)

*Primary Examiner*—Marc S. Hoff
*Attorney, Agent, or Firm*—Steven R. Bartholomew; David R. Padnes

[57] ABSTRACT

Loss of synchronization, due to a digital data signal having the same signal value for an extended number of bit or symbol periods, is overcome through the use of a coding scheme which assures transitions after each such period despite the absence of transitions in the signal to be encoded. Broadly, within the encoder, a digital input signal having m signal levels is transformed into a coded digital output signal having n possible signal values, where m<n. The transformation alters the current digital input signal value as a function of the previous coded digital output signal value and the current digital input signal value performed in a number system whose modulus is n. In a disclosed embodiment, a binary input signal is coded into an output signal having three signal levels. The transformation provided in the encoder of this disclosed embodiment provides a coded output signal whose value is equal to the previous coded output signal value +1, modulo 3, when the current value of the digital input signal is logical 1 and whose value is the previous coded output signal value −1, modulo 3, or, equivalently, the previous coded output signal value 2, modulo 3, when the current value of the digital input signal is logical "0". Advantageously, this approach can be implemented for the coding of a digital signal having two or more signal levels.

14 Claims, 2 Drawing Sheets

OTHER PUBLICATIONS

J. B. Buchner, "Ternary Line Signal Codes", *Zurich Seminar*, 1974, Philips' Telecommunicatie Industrie B.V., Hilversum—The Netherlands, pp. 1–9.

Yoram Ofek, "The Conservative Code for Bit Synchronization", *IEEE Transactions on Communications*, vol. 38, No. 7, Jul. 1990, pp. 1107–1111.

A. Croisier, "Introduction to Pseudoternary Transmission Codes", *IBM J. Res. Develop.*, Jul. 1970, pp. 354–366.

George V. Jacoby, "Ternary 3PM Magnetic Recording Code and System", *IEEE Transactions on Magnetics*, vol. Mag–17, No. 6, Nov., 1981.

Kees A. Schouhamer Immink, "Runlength–Limited Sequences", *Proceedings of the IEEE*, vol. 78, No. 11, Nov. 1990, pp. 1744–1759.

F. P. Preparata and L. Bellato, "Length–2 Alphabetic Codes for Spectrum Shaping", *Zurich Seminar*, 1974, pp. 1–6.

100

DIGITAL CODING TECHNIQUE WHICH AVOIDS LOSS OF SYNCHRONIZATION

TECHNICAL FIELD

The present invention relates to coding of digital signals of two or more signal levels and, more particularly, to such a technique which avoids a loss of synchronization due to the decoding of a coded signal which is transitionless for some time interval.

BACKGROUND OF THE INVENTION

In many communications applications, a digital data signal having an input signal rate is encoded prior to transmission through a communications channel and then decoded at a receiver. This coding, i.e., encoding/decoding, improves system performance provided the received signal can be properly decoded into the digital data signal. For proper decoding, the received encoded signal must be sampled using a clock which is synchronized to a clock at the transmitter. Loss of synchronization can arise when the coded signal is transitionless for an extended time period. This can arise when the digital data has a constant signal value for an extended period of time.

In binary systems, a number of techniques have been devised which reduce problems associated with a long sequence or "string" of constant signal values. In one solution, known as alternate mark inversion (AMI), the polarity of logical "1" signals are alternately coded with opposite polarity. While this technique operates satisfactorily, it only avoids a loss of synchronization due to long strings of logical "1" inputs. Synchronization loss can still arise when there is a long string of logical "0s". In another solution, coding techniques, such as Manchester coding and differential Manchester coding are used which ensure a transition in the coded signal level despite an unchanging input signal level. The problem with Manchester coding and its derivatives is that they are bandwidth inefficient because the transitions are provided at twice the input signal rate. In addition, they require rather complex circuitry to implement.

It would therefore be beneficial if a coding technique could be devised which was easy to implement, conserving of bandwidth, and is applicable to the coding of digital signals having two or more signal levels.

SUMMARY OF THE INVENTION

In accordance with the present invention, the shortcomings of the prior art are overcome through the use of a coding technique which assures a transition in the coded signal level despite a lack of transition in the input signal. Pursuant to the present invention, within an encoder, a digital input signal having m signal levels is transformed into an encoded signal having n signal levels, where n>m. The transformation provided is a function of all priorly received values of the digital input signal performed in a number system whose modulus is at least m+1. Or, equivalently, the transformation provided is a function of the current value of the digital input signal and the value of the encoded signal corresponding to the previous value of the digital input signal performed in a number system whose modulus is at least m+1. The decoder provides a transformation which is the inverse to that provided by the encoder. In one embodiment of the present invention, an encoder transforms a binary input signal, i.e., m=2, into a coded signal having three signal levels, i.e., n=3. Each appearance of a logical "1" is transformed into a coded output signal equal to the last output signal plus 1, modulo 3. Similarly, each appearance of a logical "0" is transformed into a coded output equal to the last output signal minus 1, modulo 3. The decoder provides the inverse of the encoder transformation to reconstruct the binary input signal. Advantageously, this approach can be implemented for the coding of a digital signal having two or more signal levels.

DETAILED DESCRIPTION

Figure 1:
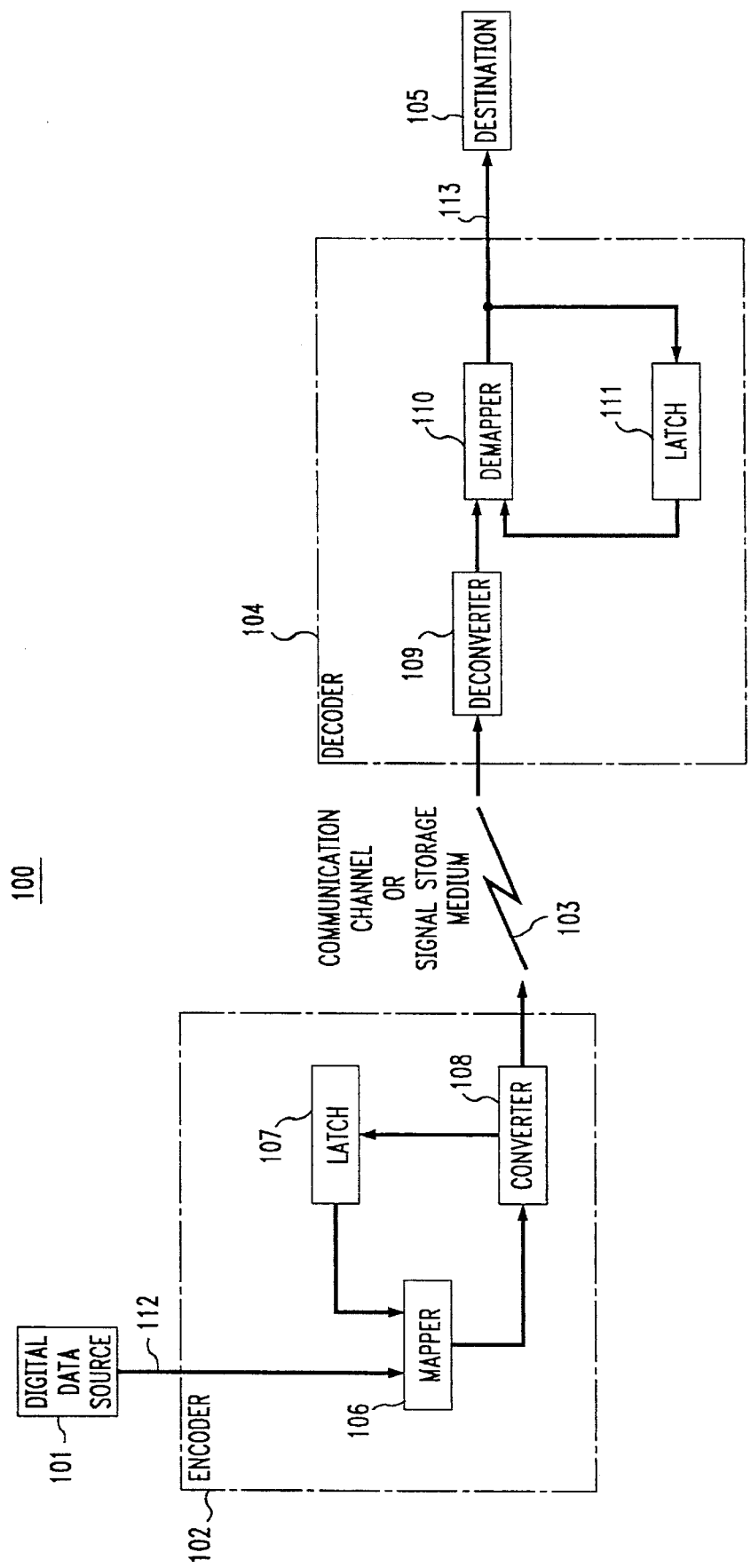
FIG. 1 is a block-schematic diagram of an illustrative embodiment of the present invention.

As shown in FIG. 1, in an illustrative embodiment 100 of the present invention, a digital data signal, which may also include control signals, is coupled from source (101) to encoder 102. This digital data signal can be a sequence of bits or symbols, the latter being representative of a plurality of bits and having some number of discrete values. The encoder transforms the digital data signal into an encoded signal which is outputted to a communications channel or signal storage medium 103. In the case of the former, the embodiment 100 is typically part of a communications system in which the encoded signal is coupled via the medium between two destinations. The coded signal provided to the communications channel or signal storage medium is decoded by decoder 104 into the digital data signal and thence coupled to destination 105. In either case, the digital data can represent a variety of different information including, voice, facsimile, video, etc.

Encoder 102 includes mapper 106, latch 107, and converter 108. Mapper 106 receives the digital data signal on lead 112 and transforms this signal into an encoded signal. The mapper is responsive to the current value of this digital data signal and the encoded mapper output corresponding to the previous digital data signal. Latch 107 stores an output of mapper 106. Relative to the current value of the digital data signal, this output is that corresponding to the previous value of the digital data signal. Converter 108 then converts the encoded signal into one suitable for transmission through the communications channel or storage in the signal storage medium. The use of converter 108, while advantageous in certain system applications, is not required by the present invention. Continuing on, deconverter 109 and demapper 110 respectively provide functions opposite to that provided by converter 108 and mapper 106. Specifically, demapper 110 transforms the coded signal into the corresponding digital data signal. The demapper is responsive to the current value of the coded signal and the previous value of the signal. This previous value is provided by latch 111. The recovered digital data signal appears on lead 113 which, during proper system operation, is identical to that provided by source 101.

To overcome any loss of synchronization due to the lack of transitions in the digital data signal on lead 112, the mapper and demapper incorporate a mapping function which insures transitions in the coded signal despite the absence of transitions in the corresponding digital data signal. For a multilevel digital data signal, i.e., a digital data signal conveying data on two or more signal levels, the output of mapper 106 can be represented by the variable O, where O is any number in the base n. In general, in accordance with the present invention, O is a function of the current value of the digital data signal (D) to be encoded and the coded signal value (P) corresponding to the previous value of the digital data signal which can be expressed as f(D,P). The coded signal corresponding to the previous value of the digital data signal will hereinafter be referred to as the previous coded signal. Or, equivalently, it may be said that O is a function of all previously received values of the digital data signal.

The function f(D,P) is such that O is never equal to P, i.e., the coded signal value always changes for successive digital data signals, and the coded signal value is different for each of the possible values of the digital data signal. One possible function which meets these requirements is when O is equal to a sum of three variables, modulo n. More specifically, $$O = f(P,D) = (P - D - W)_{modulo\ n};\qquad(1)$$

where P is the previous output of the mapper stored in latch 107; D is the current value of the input to the mapper which is any number in a modulo m number system; W is any number not congruent to 0, modulo n; and n>m+W. Congruent in this context means not equal or equivalent to in the modulo n number system. For example in modulo 3,3 is equivalent to 0. When n>m+1, Equation 1 advantageously provides the ability to eliminate DC bias and/or the coded output to convey auxiliary information in addition to the coded digital data signal. If this capability is not required, then equation (1) can be simplified by setting W=1. The functional mapping provided by the encoder is carried out in a modulus which is at least 1 greater than the number of input signal levels. For the application where W=1, m=2, n=3, and $f(D,P)=(P-D-1)_{modulo\ n}$, the coded output signals provided by mapper 106 are set forth in Table 1.

TABLE 1

|  |  | P (Previous Coded Signal) | | |
|---|---|---|---|---|
|  |  | 2 | 0 | 1 |
| D (Current Input) | 0 | 1 | 2 | 0 |
|  | 1 | 0 | 1 | 2 |

The functionality provided by Table 1 is equivalent to adding +1 to the previous output, modulo 3, when the current input value is logical "1" and subtracting "1" from the previous output, modulo 3, or, equivalently, adding +2 when the current input value is logical "0". Advantageously, each output of the mapper is converted into a predetermined voltage signal by converter 108. The conversion process respectively transforms the 2, 1 and 0 outputs of the mapper into −v, +v and 0, where v is a predetermined voltage.

The decoder provides the inverse function of the encoder. Broadly, within the decoder, the coded output signal of the encoder is transformed back into the original digital data signal through the use of a function which inverts or reverses the transformation provided by the encoder. For an encoder transformation in accordance with equation (1), the inverse transformation, $f^{-1}(P,D)$, can be expressed as $$D = f^{-1}(P,D) = (P - O - W)_{modulo\ n};\qquad(2)$$

Examining equation 2, it can be seen that the recovered digital data signal is a function of the current and previous decoder input signal values performed in a number system whose modulo is n. For the case where W=1, the demapping provided by the demapper is set forth in Table 2.

TABLE 2

|  |  | P (Previously Coded Signal) | | |
|---|---|---|---|---|
|  |  | 0 | 1 | 2 |
| O (Current Coded Signal) | 0 | 0 | — | 0 | 1 |
|  | 1 | 1 | — | 0 |
|  | 2 | 0 | 1 | — |

Figure 2:
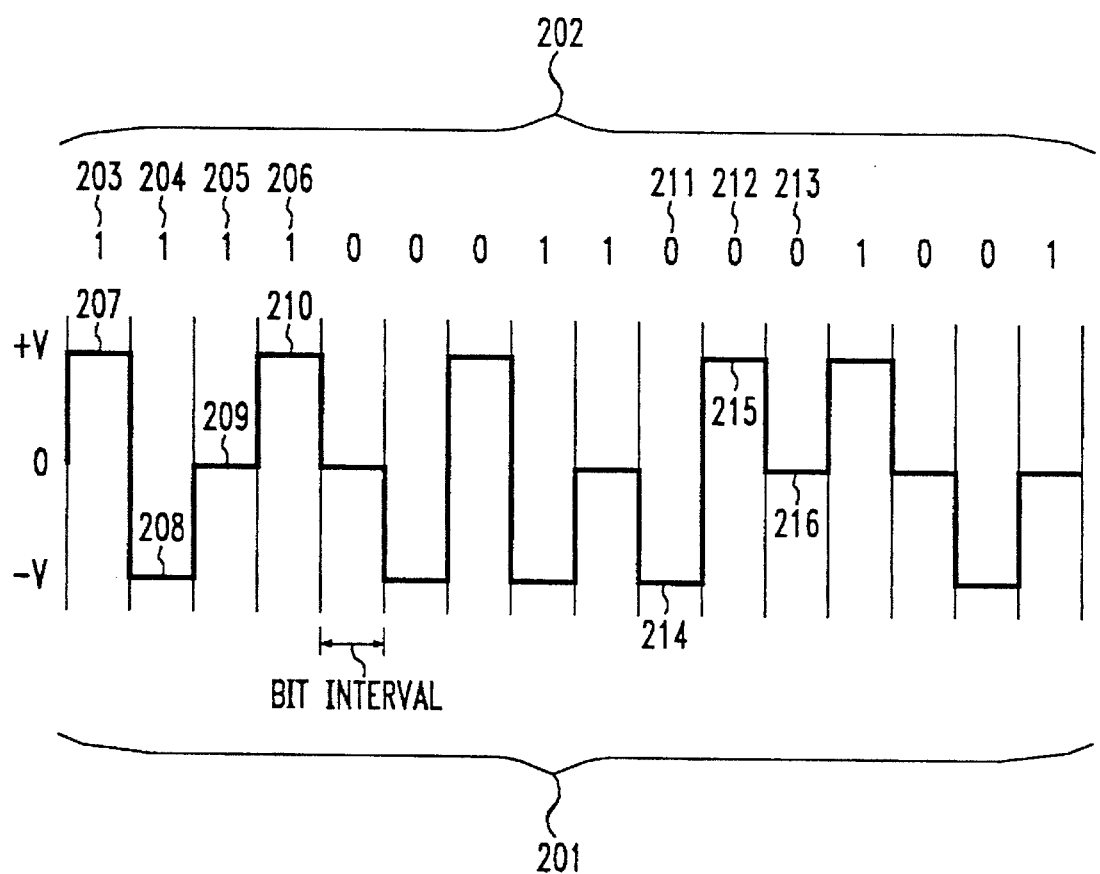
FIG. 2 is a graphical depiction of the output, the coding provided by an embodiment of the present invention.

FIG. 2 depicts the output 201 of encoder 102 for an exemplary binary data input 202. It should be noted that despite the absence of transitions in the digital data input 202 at certain times, the output of the encoder provides a transition after every bit interval during such times. For example, for the four consecutive logic "1" input values designated as 203–206, the encoder provides outputs 207–210 which have a transition after every bit interval. The same is true for any succession of logic "0" inputs. See, for example, input designations 211–213 and the corresponding outputs 214–216.

It should, of course, be noted that while the present invention has been described in reference to an illustrative embodiment, other arrangements may be apparent to those of ordinary skill in the art. First, for example, while the disclosed embodiment utilizes discrete devices, these devices can be implemented using one or more appropriately programmed, general-purpose processors or special-purpose integrated circuits or digital processes or an analog or hybrid counterpart of any of these devices. Second, for example, while in the disclosed embodiment the converter transforms the output of the mapper into one of a plurality of predetermined voltages so that the transmitted signal is amplitude modulated, the present invention is compatible for use with other modulation formats by changing the function provided by the converter and deconverter. More specifically, if the converter provided a set of output frequencies, or phases, or optical signal intensities or optical pulse widths, etc., the present invention can be used with a variety of different modulation schemes.

We claim:

1. Encoding apparatus which transforms a digital input signal into a coded digital output signal, said apparatus comprising means for receiving said digital input signal, said digital input signal having m signal levels and;

means responsive to said digital input signal for transforming this signal into said coded digital output signal having n signal levels, where n>m, and wherein said coded digital output signal is not identical to said digital input signal, said transforming means providing a transformation, which is always a function of all priorly received digital input signal levels, performed in a number system having a modulus of n.

2. The apparatus of claim 1 wherein said transformation is also another function of said digital input signal and said coded digital output signal performed in a number system whose modulus is n.

3. The apparatus of claim 2 wherein said digital input signal and said coded digital output signal each have values which vary with time and the value of said coded digital output signal for a given digital input signal is equal to a combination of a previously coded output signal value and the current digital input signal value performed in a number system having a modulus of n.

4. The apparatus of claim 2 wherein said digital input signal is a binary signal and said coded digital output signal has three signal levels.

5. Encoding apparatus for transforming a digital input signal into a coded digital output signal, said apparatus comprising means for receiving said digital input signal, said digital input signal having m signal levels:

means responsive to said digital input signal for transforming this signal into said coded digital output signal having n signal levels n>m, and wherein said coded digital output signal is not identical to said digital input signal said transforming means providing a transformation which is always a function of all priorly received digital input signal levels performed in a number system having a modulus of n;

wherein said transformation is also another function of said digital input signal and said coded digital output signal performed in a number system having a modulus of n;

wherein said digital input signal and said coded digital output signal each have values which vary with time and the value of said coded digital output signal for a given digital input signal is equal to a combination of a previously coded output signal value and the current digital input signal value performed in a number system having a modulus of n;

wherein said digital input signal is a binary signal and said coded digital output signal has three signal levels; and wherein the value of said coded digital output signal at any time is equal to the last coded digital output signal value plus one, modulo 3, when the current value of said digital input signal is logical "1", and is equal to the last coded digital output signal value plus "2", modulo 3, when the current value of said digital input signal is logical "0".

6. The apparatus of claim 5 wherein the value of said coded digital output signal at any time is equal to the immediately preceding coded digital output signal value plus 1, modulo 3, when the current value of said digital input signal is logical "1", and is equal to the immediately preceding coded output signal value minus 1, modulo 3, when the current value of said digital input signal is logical "0".

7. A method for encoding a digital input signal into a digital output signal, said method comprising the steps of receiving said digital input signal, said digital input signal having m signal levels; and transforming said digital input signal into said digital output signal such that said digital output signal is not identical to said digital input signal, said digital output signal having n levels, where n>m, said transforming means, providing a transformation which is always a function of all priorly received said digital input signal levels, performed in a number system having a modulus of n.

8. Decoding apparatus which transforms a digital input signal into a digital output signal, said apparatus comprising means for receiving said digital input signal, said digital input signal having n signal levels; and means responsive to said digital input signal for transforming this signal into said digital output signal such that said digital output signal is not identical to said digital input signal, said digital output signal having m signal levels, where n>m, said transforming means providing a transformation, which is always a function of successive values of said digital input signal, performed in a number system having a modulus of n.

9. The apparatus of claim 8 wherein said digital input signal and said digital output signal each have values which vary with time, and the value of said digital output signal for a given digital input signal value is equal to a combination of this value and the value of a prior digital input signal value performed in a number system having a modulus of n.

10. The apparatus of claim 8 wherein said digital output signal is a binary signal and said digital input signal has three signal levels.

11. The apparatus of claim 10 wherein the value of said digital output signal at any time is a function of a difference between the values of two successive digital input signals, modulo n.

12. A decoding apparatus which transforms a digital input signal into a digital output signal, said apparatus comprising means the receiving said digital input signal, said digital input signal having n signal levels; and means responsive to said digital input signal for transforming this signal into said digital output signal, said digital output signal having m signal levels, where n>m said transforming means providing a transformation, which is always a function of successive values of said digital input signal, performed in a number system having a modulus of n:

wherein said digital output signal is a binary signal and said digital input signal has three signal levels, wherein the value of said digital output signal at any time is a function of a difference between the values of two successive digital input signals, modulo n, and wherein the value of said digital output signal at any time is equal to 1 less than a difference between the values of two successive digital input signals, modulo n.

13. A method of decoding a digital input signal into a digital output signal, said method comprising the steps of receiving said digital input signal, said coded output signal having n signal levels and;

means responsive to said digital input signal for transforming this signal into said digital output signal such that said digital output signal is not identical to said digital input signal, said digital output signal having m signal levels, where n>m, said transforming step providing a transformation, which is always a function of successive values of said digital input signal, performed in a number system having a modulus of n.

14. Encoding apparatus which transforms a digital input signal into a coded digital output signal, said apparatus comprising means for receiving said digital input signal, said digital input signal having m signal levels and said digital input signal having a value equal to any one of said m signal levels at each of a plurality of times, and means responsive to said digital input signal for transforming the signal into said coded digital output signal having n signal levels, where n is greater than m, and wherein said digital input signal is not identical to said digital output signal, said transforming means providing a transformation which is invariant with the values of said digital input signal at two consecutive times in said plurality of times, said transformation being a function of all priorly received digital input signal levels, performed in a number system having a modulus of n.

* * * * *